US012783756B2

(12) United States Patent
Arabi

(10) Patent No.: US 12,783,756 B2
(45) Date of Patent: Nov. 3, 2026

(54) QUICK METHOD FOR ACCURATELY ESTIMATING AVERAGE ELECTRON DENSITIES

(71) Applicant: UNITED ARAB EMIRATES UNIVERSITY, Al Ain (AE)

(72) Inventor: Alya A. Arabi, Al Ain (AE)

(73) Assignee: UNITED ARAB EMIRATES UNIVERSITY, Al Ain (AE)

( * ) Notice: Subject to any disclaimer, the term of this patent is extended or adjusted under 35 U.S.C. 154(b) by 5 days.

(21) Appl. No.: 18/517,619

(22) Filed: Nov. 22, 2023

(65) Prior Publication Data

US 2025/0165676 A1 May 22, 2025

(51) Int. Cl.
*G06F 30/25* (2020.01)

(52) U.S. Cl.
CPC .................................... *G06F 30/25* (2020.01)

(58) Field of Classification Search
CPC ........................................................ G06F 30/25
USPC ............................................................ 703/12
See application file for complete search history.

(56) References Cited

FOREIGN PATENT DOCUMENTS

CN 115171809 A 10/2022

OTHER PUBLICATIONS

Denis et al. "Fragment-Based Drug Discovery: Opportunities for Organic Synthesis" RSC Med. Chem. (2021) vol. 12, pp. 321-329 (Year: 2021).*

Cremer et al. "A Description of the Chemical Bond in Terms of Local Properties of Electron Density and Energy" (1984) Croatica Chemica Acta, vol. 57, No. 6, pp. 1259-1281 (Year: 1984).*

Novikov et al. "Improving Performance of Docking-Based Virtual Screening by Structural Filtration" J. Mol. Model (2010) 16:1223-1230. (Year: 2010).*

Terwilliger "SOLVE and RESOLVE: Automated Structure Solution, Density Modification, and Model Building", J. Synchrotron Rad. (2004), No. 11, pp. 49-52 (Year: 2004).*

Arabi. "Atomic and molecular properties of nonclassical bioisosteric replacements of the carboxylic acid group." Future Medicinal Chemistry 12.12 (2020): 1111-1120.

Arabi . . . "Routes to drug design via bioisosterism of carboxyl and sulfonamide groups." Future medicinal chemistry 9.18 (2017): 2167-2180.

Osman, et al. "Quantum and Classical Evaluations of Carboxylic Acid Bioisosteres: From Capped Moieties to a Drug Molecule." ACS omega 8.1 (2022): 588-598.

Matta, et al . . . "Electron-density descriptors as predictors in quantitative structure-activity/property relationships and drug design." Future medicinal chemistry 3.8 (2011): 969-994.

Matta, et al. "The bioisosteric similarity of the tetrazole and carboxylate anions: clues from the topologies of the electrostatic potential and of the electron density." European journal of medicinal chemistry 45.5 (2010): 1868-1872.

* cited by examiner

*Primary Examiner* — Jerry Lin
(74) *Attorney, Agent, or Firm* — Nath, Goldberg & Meyer; Joshua B. Goldberg

(57) ABSTRACT

A quick method and system for calculating, estimating, or predicting average electron densities of molecules, or for different parts of molecules is provided. The molecules having the desired predicted AED values can then by synthesized for further use. These methods can be used for determining, for example, bioisosteres of a molecule of interest. The present methods and systems can be used to aid in many applications including but not limited to the development of drug design.

26 Claims, No Drawings

QUICK METHOD FOR ACCURATELY ESTIMATING AVERAGE ELECTRON DENSITIES

BACKGROUND

1. Field

The disclosure of the present patent application relates to quick methods and systems for calculating, estimating, or predicting average electron densities of molecules, or for different parts of molecules. The molecules having the desired predicted AED values can then by synthesized for further use.

2. Description of the Related Art

In general, various chemical and other physical properties of various molecules can be classified by numerous tools. For example, methods of using electron density to quantify the mean positions of atoms in chemical compounds, their chemical bonds, and other information are currently generally known.

Creating and synthesizing certain new molecules or conformers of molecules with specific properties and reactivities is possible via the Average Electron Density (AED) tool. AED values are calculated using quantum simulations and post-optimization quantum simulations to partition the molecular space into atomic spaces. Quantum simulations are often referred to as ab-initio methods as they calculate all properties from first principles. Because the properties of an atom do not depend only on the atom itself, but also its environment, the same element can have drastically different properties depending on its environment, in other words, the surrounding atoms. Quantum methods and tools such as the quantum theory of atoms in molecules (QTAIM), by constructions, capture these changes, and this is one of the reasons for their accuracy. The drawback of quantum simulations is that they are very computationally expensive, and there is a need to find ways to compute AEDs more efficiently, yet accurately.

In this regard, the average electron density (AED) tool is based on the partitioning of a molecule into atomic basins using the quantum theory of atoms in molecules (QTAIM) partitioning scheme. The starting point of QTAIM is the topological analysis of the molecular electron-density distributions to extract atomic and bond properties that characterize every atom and bond in the molecule. These atomic and bond properties have considerable potential as bases for the construction of robust quantitative structure-activity/property relationships models. QTAIM is applicable to the electron density calculated from quantum-chemical calculations and/or that obtained from ultra-high resolution x-ray diffraction experiments followed by non-spherical refinement.

There are a number of publications that use quantum software and computational simulations to compute Average Electron Density (AED) values of various molecules, or of various parts of molecules. These include:

Osman et al., "Quantum and Classical Evaluations of Carboxylic Acid Bioisosteres: From Capped Moieties to a Drug Molecule", *ACS Omegai,* 8 (1), 588-598.

Arabi, "Atomic and molecular properties of nonclassical bioisosteric replacements of the carboxylic acid group", *Future Medicinal Chemistry,* 12 (12), 1111-1120.

Arabi, "Routes to drug design via bioisosterism of carboxyl and sulfonamide groups", *Future medicinal chemistry,* 9 (18), 2167-2180.

Arabi et al., "Investigation of the molecular electrostatic potentials and the average electron densities of non-classical bioisosteres", *ABSTRACTS OF PAPERS OF THE AMERICAN CHEMICAL SOCIETY,* 253.

Arabi et al., "Electrostatic potentials and average electron densities of bioisosteres in methylsquarate and acetic acid", *Future Medicinal Chemistry,* 8 (4), 361-371.

Matta et al., "The bioisosteric similarity of the tetrazole and carboxylate anions: clues from the topologies of the electrostatic potential and of the electron density", *European journal of medicinal chemistry,* 45 (5), 1868-1872.

However, there are no currently known tools capable of quickly estimating and predicting average electron densities of different molecules to assist in selecting most likely molecules to have specific desired utility for synthesis and further analysis. Thus, a new tool solving these problems is desired.

SUMMARY

The methods and systems described herein relate to a new quick method that can accurately estimate Average Electron Densities (AEDs) of molecules of interest. These methods stand in stark contrast to the currently available and used methods for estimating AEDs, which can involve running a large number of simulations to collect quantum AED properties for each atom of the molecules of interest depending on each atom's identity and chemical bonds of the atom and its surrounding atoms. Instead, the present methods and systems tabulate properties for all atoms in one or more molecules of interest in all their different environments These tabulated values can then be used to predict the AED of any molecule made of the atoms in the table(s), and they can be used to synthesize molecules with specific desired AEDs for any desired application, including, but not limited to, drug design, environmental studies, engineering, material sciences, medicine, vaccines, molecular chemistry and biochemistry, food additives, beverages, cosmetics, perfumeries, quantitative structure-activity relationships (QSAR), etc. The method has a high accuracy of around or about 95%.

The present methods and systems can be used to predict new drug molecules. They can also be used to estimate the quantum AED properties of drug moieties or any molecule (in part or fully) without having to run quantum simulations.

In an embodiment, the present subject matter relates to a method for quickly and accurately determining an Average Electron Density (AED) of a molecule or a part of a molecule, the method comprising:

- generating a list of molecules;
- generating a table of atoms in each molecule in the list of molecules, wherein each atom in the table of atoms is identified by a combination of its specific elemental type and its environment;
- generating average electron densities (AEDs) for each element at a given environment as listed in the table of atoms in each molecule in the list of molecules;
- selecting one or more further molecules;
- identifying the one or more further molecule's environment including elements and types of bonds for each atom in the one or more further molecules and which other elements each atom in the one or more further molecules is connected to through each bond;

finding an environment from the table of atoms in each molecule in the list of molecules matching an environment for each atom in the one or more further molecules; and obtaining an average electron density (AED) of the one or more further molecules or for a part of the one or more further molecules by taking a ratio of a sum of atoms in the one or more further molecules or in the part of the one or more further molecules.

In an embodiment, following this last step, a further process or method can include matching the average electron density (AED) of the atoms of the one or more further molecules or the part of the one or more further molecules to an average electron density of atoms in a molecule or a part of a molecule having a known desired activity to identify a matching further molecule or a matching part of the further molecule.

In certain embodiments in this regard, once the average electron density (AED) is obtained, calculated, determined, and/or generated for the one or more further molecules, or the one or more parts of the one or more further molecules, this AED of the atoms of the further molecule or the part of the further molecule can be matched with a known AED of atoms of another molecule or a part of another molecule having a desired chemical, material, pharmaceutical, and/or other property. Once a proper AED match is found, for example, a matching AED within up to 10%, up to 3%, up to 1.5%, up to 1%, or up to 0.5% of the AED of the atoms of the molecule or the part of the molecule having the desired activity, the matched molecule or a molecule having the matched part of the molecule can be created and synthesized for further analysis.

Similarly, the presently described Quick AED tool can be used to construct robust quantitative structure-activity/property relationships models.

In one embodiment, the present subject matter relates to a method for creating and synthesizing a molecule having desired chemical, material, pharmaceutical, or other properties, the method comprising:

generating a list of molecules;

generating a table of atoms in each molecule in the list of molecules, wherein each atom in the table of atoms is identified by a combination of its specific elemental type and its environment;

generating average electron densities (AEDs) for each part of each molecule in the list of molecules;

selecting one or more further molecules;

identifying the one or more further molecule's environment including elements and types of bonds for each atom in the one or more further molecules and which other elements each atom in the one or more further molecules is connected to through each bond;

finding an environment from the table of atoms in each molecule in the list of molecules matching an environment for each atom in the one or more further molecules;

obtaining an average electron density (AED) of the one or more further molecules or for a part of the one or more further molecules by taking a ratio of a sum of atoms in the one or more further molecules or in the part of the one or more further molecules;

matching the average electron density (AED) of the atoms of the one or more further molecules or the part of the one or more further molecules to an average electron density of atoms in a target molecule or a part of the target molecule included in the list of atoms in the table of atoms in each molecule in the list of molecules to identify a matching further molecule or a matching part of the further molecule; and selected the identified matching further molecule for further analysis.

In an embodiment, the table of atoms in each molecule in the list of molecules in any of the present methods can have a variety of elements in different environments. For example, if a first molecule in the list has an overlapping element at a given environment with a second molecule, only one entry (one row) would be created in the table. In an embodiment, this one entry can be the average of the two molecular occurrences of the specific element in this example, or the average of more occurrences of the specific element in other examples. Accordingly, for any of the methods described herein, the steps of listing each atom of each molecule in the table of atoms, generating the table of atoms, tabulating the atoms in each molecule, or the like automatically and inherently include taking an average of each overlapping element at a given environment such that only one entry (one row) is created in the table for all of such overlapping elements.

Certain non-limiting examples of the elemental type, also referred to as elements as used herein, include carbon, nitrogen, hydrogen, sulfur, oxygen, halogens, phosphorous, and the like.

In another embodiment, the present subject matter relates to a method for creating and synthesizing a molecule having desired chemical, material, pharmaceutical, or other properties, the method comprising:

generating a list of molecules;

generating a table of atoms in each molecule in the list of molecules, wherein the table of atoms in each molecule in the list of molecules is generated by a method comprising:

building each molecule;

running a quantum simulation of each molecule to obtain a wavefunction of each molecule;

performing post processing on the wavefunction of each molecule to obtain atomic properties of each molecule;

extracting volumes and electron populations for each atom of each molecule at a specific isodensity;

assigning each atom of each molecule its identity based on its specific elemental identification and its environment; and listing each atom of each molecule at a given environment as taken from each molecule in the list of molecules;

generating average electron densities (AEDs) for each atom at a given environment as taken from each molecule in the list of molecules;

selecting one or more further molecules;

identifying the one or more further molecule's environment including elements and types of bonds for each atom in the further molecule and which other elements each atom in the further molecule is connected to through each bond;

finding an environment from the table of atoms in each molecule in the list of molecules matching an environment for each atom in the one or more further molecules;

obtaining an average electron density (AED) of the one or more further molecules or for a part of the one or more further molecules by taking a ratio of a sum of atoms in the one or more further molecules or in the part of the one or more further molecules;

matching the average electron density (AED) of the atoms of the one or more further molecules or the part of the one or more further molecules to an average electron density of atoms in a target molecule or a part of the target molecule to identify a matching further molecule or a matching part of the further molecule;

selecting the identified matching further molecule or a molecule containing the matching part of the further molecule for further analysis; and synthesizing the identified matching further molecule or the molecule containing the matching part of the further molecule to obtain the matching molecule having the desired material, chemical, pharmaceutical or other properties used to conduct the further analysis of the identified further molecule.

In certain embodiments, the present subject matter relates to a method for validating an average electron density (AED) for a molecule, the method comprising:

obtaining a table of atoms for each atom at a given environment as taken from each molecule in a list of molecules, wherein each atom in the table of atoms is identified by a combination of its specific elemental type and its environment and includes average electron densities (AEDs) for each atom at the given environment as taken from each molecule in the list of molecules;

selecting one or more further molecules;

building a simulation of the one or more further molecules;

running a quantum simulation of the simulation of the one or more further molecules to obtain a wavefunction of each of the one or more further molecules;

performing post processing on the wavefunction of each of the one or more further molecules to obtain atomic properties of each molecule of the one or more further molecules;

extracting volumes and electron populations for each atom of each molecule of the one or more further molecules at a specific isodensity; and obtaining an average electron density (AED) of the selected atoms of each molecule of the one or more further molecules by taking a ratio of a sum of atoms in the further molecule or in the part of the further molecule. In this regard, the accuracy of reproducing the results of the quantum calculation/simulation using the present Quick AED table method can be 95% or above using the present method.

In certain other embodiments, the present subject matter relates to a method for creating and synthesizing a molecule having desired chemical, material, pharmaceutical, or other properties, the method comprising:

obtaining a table of atoms for each atom at a given environment as taken from each molecule in a list of molecules, wherein each atom in the table of atoms is identified by a combination of its specific elemental type and its environment and includes average electron densities (AEDs) for each atom at the given environment as taken from each molecule in the list of molecules;

selecting one or more further molecules;

selecting those atoms of each molecule of the one or more further molecules matching desired atoms in the table of atoms in each molecule of the list of molecules; and obtaining an average electron density (AED) of the selected atoms of each molecule of the one or more further molecules by taking a ratio of a sum of atoms in the further molecule or in the part of the further molecule. According to this embodiment, the obtained AED using the quantum calculation steps can validate the utility of the Quick AED method described herein.

Various embodiments of the present subject matter include combining different portions of the various methods described herein with other portions of the various methods described herein. Such combinations could include, by way of non-limiting example, a portion of one method described herein relating to obtaining the table of atoms with a portion of a different method described herein relating to identifying a matching molecule.

In certain other embodiments, the matching molecule or the matching part of the matching molecule is a bioisostere of the target molecule or the target part of the target molecule.

In a further embodiment of the present methods, those atoms of each molecule of the one or more further molecules matching desired atoms in the table of atoms in each molecule of the list of molecules are selected based on one or more selected from the group consisting of matching average electron densities (AEDs), matching environments, matching volumes, matching electron populations, and combinations thereof. In further embodiments in this regard, the extracted data from the further molecule or the part of the further molecule can be used to select the atoms relevant to the target molecule, i.e., to a bioisosteric molecule or a bioisosteric moiety, or to a molecule having a shared or common activity with the target molecule.

In further embodiments, the present methods relate to methods of selecting, creating and/or synthesizing a molecule having desired chemical, material, pharmaceutical, or other properties comprising selecting a target molecule or a portion of a target molecule having a target average electron density (AED); identifying a matching molecule or a portion of a matching molecule having a combination and/or a ratio of a sum of atoms matching the target average electron density (AED); and obtaining the matching molecule. In this regard, it is important to note that not any combination of atoms that gives a specific AED can be built into a molecule or a part of a molecule. For example, it is important to check that the connectivity of the atoms in the identified matching molecule or matching part of a matching molecule is chemically permitted without violating the rules of chemistry (e.g., the octet rule where the matching molecule cannot have a neutral carbon atom having 5 bonds).

The present methods and systems can thus be used to aid in the development of drug design and many other applications including, but not limited to, materials science applications, the development of chemical probes, determining chemical reactivities, conducting analyses of crystalline structures, synthesizing pairs of matching molecules, predicting matching conformers, creating new molecules with the desired property of the conformer, designing new molecules with matching properties, developing a strategy of matching molecules of pairs to decide on their similarities in properties and reactivities (e.g. toxicity, polarizability), modelling conformers, and applications in computational chemistry, medicine, engineering, pharmaceuticals, material properties, drug design, cosmetics, etc.

In one aspect, the matching as described herein can relate to matching different molecules, or parts of different molecules, having an AED threshold difference of, in different embodiments, up to 10%, up to 3%, up to 1.5%, up to 1%, or up to 0.5%.

In certain embodiments, the calculated average electron densities (AED) values can be calculated as a sum of electron population divided by a sum of volumes, of all atoms in each molecule being studied, or in the part of each molecule being studied.

In this regard, such methods may further comprise screening the matched molecules, or the matched molecule parts, for the desired chemical properties, pharmaceutical properties, or chemical and pharmaceutical properties. For example, the desired pharmaceutical properties may be one or more selected from the group consisting of potency, solubility, permeability, metabolic stability, transporter effects, bioavailability, metabolism, clearance, and toxicity. Similarly, the desired chemical properties may be one or more selected from of the group consisting of mechanical, electrical, thermal, magnetic, optical, and deteriorative properties which may impact surface chemistry as it relates to materials sciences, for example. Impacts on engineering applications are also possible, for the reasons given above.

In certain embodiments, the new methods reported herein can be used to quickly calculate an average electron density for a molecule, or a part of the molecule, irrespective of the application for the method and/or molecule, e.g. finding bioisosteres, matching conformers, finding molecules having a shared or common activity, etc. Further, the present methods can be used to not only quickly obtain an average electron for a molecule, but also to do so without conducting any quantum simulations, thereby saving a lot of money, time, manpower, expertise (even noncomputational scientists can use the table), computer resources, $CO_2$ to the environment, energy, heat, and the like.

These and other features of the present subject matter will become readily apparent upon further review of the following specification.

DETAILED DESCRIPTION OF THE PREFERRED EMBODIMENTS

Definitions

As used herein, the terms "bioisostere", "bioisosteres", "bioisosterism", "bioisosteric", and the like are used interchangeably herein to refer to substituents or groups that impart similar biological properties to a chemical compound; for example, the bioisosteric replacement of a hydrogen atom with a fluorine atom within a drug molecule will generally have no influence on the drug's efficacy, but it may prolong the drug's half-life by inhibiting metabolic oxidation. Thus, the purpose of exchanging one bioisostere for another is to fine tune the pharmacokinetic or pharmacodynamic properties of a bioactive compound.

As used herein, molecules having "commonalities" or a "common structure", one to another, are considered to be essentially homologous to each other. In the alternative, depending on context, the term "common" can be used herein to refer to multiple different molecules having essentially homologous properties, such as pharmaceutical properties, to each other. By way of non-limiting example, if a specific pharmaceutical property of two different molecules is within +/−10% of one another, they would be considered as "common" to one another. In certain embodiments, if the specific pharmaceutical property of two different molecules is within +/−5% of one another, they would be considered as "common" to one another.

As used herein, molecules having calculated AED values that are "equivalent" to or "match" one another means that the respective values are close enough to one another such that a person of ordinary skill in the art would recognize such molecules as likely to share common properties. By way of non-limiting example, if the AED values of two different molecules are within +/−15% of one another, they would be considered as "equivalent" to one another. In certain embodiments, if the AED values of two different molecules are within +/−10, 9, 8, 7, 6, 5, 4, 3, 2, 1.5, 1, or 0.5% of one another, they would be considered as "equivalent" to one another.

The presently described subject matter relate to the efficient, quick, accurate, and reliable identification and matching of different molecules. Accordingly, the present subject matter is directed to a "Quick AED" tool for quickly determining the average electron density (AED) of any molecule, any part of any molecule, or any collection of any grouping of atoms representing a molecule or a part of a molecule.

In one embodiment, the present methods and systems relate to a new "Quick AED" tool which can readily, quickly, and easily make use of the Average Electron Density (AED) to assist in developing and matching different molecules without the need of computational expertise. The activity of a molecule is linked to its chemical structure. Therefore, studying this structure is extremely important. Once the list of elements in a given environment is generated from the list of molecules, they can be used to quickly compare respective AED values, and thus obtain "matching" molecules. Further studies can be done to determine how matched molecules may impact drug design, chemical reactivities, engineering applications, and materials science applications, quantitate structure-activity relationship, among others.

This approach permits the quick identification, classification, evaluation, and matching of average electron density (AED) values of different molecules. Previously, it was only possible to evaluate and classify AED values by using time consuming and difficult quantum simulations. The present tool represents a new highly accurate and specific quantitative method for evaluating, measuring, classifying, and working with AED values to develop, obtain, find, create, and synthesize matching molecules. Accordingly, the present methods can save a lot of time (from a process that takes hours up to days for a small molecule, if not even weeks and months for large complex molecules to a few seconds assuming the environment of the atoms in the new molecules of interest is already available in the generated table of atoms in different environments), money (of hiring experts, to purchase software, to have computing facilities, and to run these machines, this is a reduction of thousands of dollars to nearly no cost), computer resources (does not need more than a simple calculator as opposed to big computing machines or even big High Performance Computing (HPC) infrastructure for large complex molecules), and it heat and $CO_2$ emission reductions (this is a huge savings that can have serious impact on our environment). In addition, this method is simple and can be very easily used by anyone; no quantum expertise nor computational expertise are needed for someone to know how to apply this method to accurately predict quantum properties.

In this regard, the uniqueness of the present methods is in their power to quickly predict AEDs of any molecule in the world, and they are designed in such a way to consistently give accurate predictions. A person employing the new methods presented herein does not need high expertise in computational sciences, in chemistry, in molecular sciences, in quantum theories, nor in using advanced software. The idea is inventive as it presents a new method that offers a lot of advantages.

Overall, the present methods can be used to:

1) speed up the entire process of AED prediction while saving money, $CO_2$, expertise, and time. This is based on the development of a new concept of AED values for elements in different environments.
2) synthesize new drug molecules, as the new molecules can be developed in a minimal amount of time and expertise and then check if their AED is the same as the target molecule. This result can then be used in designing and synthesizing new molecules with desired application in drug design for any disease or even for applications in any other field.
3) target the design and synthesis of a new molecular model of a full molecular structure or partial groups of a molecule that have a specific AED, through the table, in other words generate and design a structure that has a target AED.
4) treatment: this is one example (but this reported method is not limited to this example, and can be applicable in many other treatments), as the present methods can quickly calculate AEDs and use the estimated AEDs to tailor different reactivity and mechanical behavior to develop biocompatible materials in medical devices and tissue engineering.

Average Electron Density (AED)

The average electron density (AED) tool is based on the partitioning of a molecule into atomic basins using the quantum theory of atoms in molecules (QTAIM) partitioning scheme. The starting point of QTAIM is the topological analysis of the molecular electron-density distributions to extract atomic and bond properties that characterize every atom and bond in the molecule. These atomic and bond properties have considerable potential as bases for the construction of robust quantitative structure-activity/property relationships models. QTAIM is applicable to the electron density calculated from quantum-chemical calculations and/or that obtained from ultra-high resolution x-ray diffraction experiments followed by non-spherical refinement.

QTAIM allows the evaluation of properties of atoms in molecules, and subsequently parts of molecules, which is needed in many applications including, but not limited to, e.g., bioisosteric replacements in drug designs, developing structure-activity relationships, and the like. In QTAIM, the zero flux surfaces separate atoms into their own atomic basins. Then by operating different mathematical operators on the atomic basins, followed by numerical integrations, atomic properties of atoms in molecules can be evaluated. These properties include, volumes, charges, electron densities, areas, and average electron densities.

The average electron density (AED) is defined as the total electron population of a group of a molecule or of the full molecule divided by the corresponding volume. The internal interatomic limits between two atoms are determined by the internal zero-flux interatomic surfaces within the molecular interior, and the outer limit is set at the external 0.0004, 0.001, or 0.002 atomic unit isodensity envelope. The volumes and electron populations used to calculate the AED are those defined within Bader's quantum theory of atoms in molecules, a theory that partitions the molecular electron density into separate atomic basins separated by surfaces of zero-flux in the gradient vector field associated with the density. The atomic properties are then obtained by numerical integrations over each atomic basin. The AED properties of a specific molecular group are the sum of the properties of the atoms constituting this group.

The average electron density of a group is given by the formula:

$$\rho = \sum Ni / \sum Vi \tag{8}$$

where Ni is the electron population of each atom i, and Vi is the volume of each atom i.

In one embodiment, the wavefunction file obtained from the QM simulation can be further analyzed and processed using AIMAll software, from TK Gristmill Software (Overland Park, KS), based on the QTAIM theory. The AIMAll software package can be used for atomic integrations based on QTAIM. The interatomic basins can be delimited by zero-flux surfaces, and the outer limit of the atomic basins can be defined at three different isodensity envelopes of 0.0004, 0.001, or 0.002 a.u. AIMAll software is typically used for performing quantitative and visual QTAIM analyses of molecular systems, starting from molecular wavefunction data.

Likewise, AED values can be calculated by starting with, for example, a Gaussian software package, such as, for example, Gaussian16, with molecules optimized in the gas phase. In one embodiment, the level of theory used is the B3LYP density functional theory, namely B3LYP/6-311++G (d,p)//B3LYP/6-311++G (d,p) with ultrafine pruned (99, 590) grids and 'tight' self-consistent field optimization criteria. Vibrational frequency analysis was completed to confirm that the optimized geometries have no imaginary frequencies, in other words, they are not transition states. Here even if other (reasonable) details of the QM simulation are used, they will still give the same result.

In another embodiment, the Hershfield scheme may be used for partitioning the basins of atoms in molecules. The Hirshfeld (1977) method apportions the electron density among the atoms by the appropriate weighting. The weights are related by the atomic contribution to the promolecular density:

$$w_A(r) = \frac{\rho^A_{atm}(r)}{\rho_{pro}(r)}$$

The fragment of the density apportioned to atom A is $$\rho^A_{frag}(r) = w_A(r)\ \rho_{mol}(r)$$

An alternative scheme is based on the atomic contributions to the total promolecular potential $V_{pro}$ defined as the sum of the electronic and nuclear contributions.

In one embodiment of the present methods, AED values are determined for the entire molecules being studied. In another embodiment, the AED values are determined for a portion or part of the molecules being studied, i.e., an active group of the molecules being studied.

New Bioisostere Discovery

In certain embodiments, the present subject matter also relates to the use of the present methods in discovering new bioisosteres of a molecule at very fast rates.

By way of non-limiting example, one such embodiment relates to practicing the methods as described herein, wherein the matching molecules, or parts of molecules, are considered as bioisosteres of one another.

Drug Design

Once the present methods are performed, the knowledge can be used to determine which new molecules, or parts of new molecules, specifically would be best suited for drug design. This knowledge can then be extended to other molecules matching a first molecule identified as best suited for drug design. The selected matching molecule(s) can then be synthesized to conduct further analysis on their suitability for drug design.

The present tool can be used to improve lead optimization and drug design by optimizing pharmaceutical properties, improving potency, enhancing specificity, and reducing side effects, all of which can improve the wellbeing of patients, reduce their pain, reduce inconveniences of facing side effects, and save money for the pharmaceutical companies in developing new drugs.

The screening process to determine potential drug candidates can be conducted according to any method known to those of ordinary skill in the art such as, for example, using high-throughput screening arrays. The present methods and systems can speed up what is commonly a long and difficult process by targeting specific conformers of the selected molecules that are more likely to possess a desired activity, removing many of the steps from the typical screening process. The present methods and systems act as a filter to enrich the hit rate compared with typical random screening of conformers of a given molecule, but not different molecules, although the latter is also possible.

Further, the present methods can assist in rapidly identifying potential candidates for treating a specific disease, disorder, or condition. This can be particularly useful when there is an urgent need for treating such a disease, disorder, or condition, for example, when a new disease starts spreading among humans, thus requiring urgent new drugs for treatment. COVID-19 would be one non-limiting example in this regard.

In one example, COX-2 inhibitors are known to be effective as anti-inflammatory drugs. However, may COX-2 inhibitors have been shown to have potential serious side effects and/or safety concerns, causing them to be taken off the market. Rofecoxib is an example of an effective COX-2 inhibitor taken off the market due to such safety concerns, as it was linked to increases in heart attacks and strokes. In contrast, celecoxib is a COX-2 inhibitor that remains available in the US due to relatively diminished safety concerns. The Quick AED tool described herein can be used to distinguish those COX-2 inhibitors that have a combination of suitable effectiveness and a reduced incidence of side effects, i.e., to identify further molecules that behave more like celecoxib than like rofecoxib.

Likewise, the quick AED tool described herein can be used to identify the components responsible for determining whether murine adipose tissue deposits are comprised of cellulose fat or mitochondrial content, and thus can be used to differentiate between molecules targeting the desired type of adipose tissue deposits.

Similarly, in cancer treatment, the efficacy of the methotrexate drug to inhibit dihydrofolate reductase (DHFR) is influenced by the rate of proton tunneling, which itself depends on the conformer of the molecule. The quick AED tool can differentiate between molecules that could or could not have proton tunneling and synthesize ones that have the desired properties.

In another example, inhibition of bacterial RNAP with the Gfh1-CTD inhibitor is reported as anti-bacterial therapies. At different pH, different conformers of Gfh1-CTD are available. The quick AED tool can distinguish all the conformers of Gfh1-CTD that can or cannot inhibit RNAP and synthesize the one that do inhibit. Such learnings can be extended to identify further molecules of interest likely to have such similar properties.

Once the best molecule for the specific drug design is selected, this can then be translated to identifying the matching other molecule which is also likely to be suitable for the drug design. Once either molecule is selected, the molecule can then be produced, synthesized, or the like to conduct further testing under real world conditions.

Materials Science

Once the present methods are performed to identify matching molecules of a given molecule, the knowledge can be used to determine which molecules specifically would be best suited for satisfying certain materials science needs and requirements. This knowledge can then be extended to the other molecules matching the first molecule identified as best suited for satisfying certain materials science needs and requirements. The selected matching molecule(s), or part of molecule(s), can then be synthesized to conduct further analysis on their suitability for satisfying certain materials science needs and requirements under real world conditions.

For one example, selecting a building material based on different molecules can lead to different physical properties of the material build, e.g., due to possibly different electron conductivity (melting properties, etc.). Therefore, finding matching molecules means moving one step forward in grouping molecules that would likely share similar material properties once used in building materials. In this way, both the initially selected molecule and the matching molecule can be physically tested to ensure they share similar and desirable material properties, for example, when producing building materials.

In another example, the present Quick AED tool can be used to determine refractive indices of crystalline amino acid derivatives, focusing on the role of intermolecular interactions and the crystal packing on determining the optical linear properties of organic materials.

Similarly, the topology of the average electron density at the Valence Shell Charge Concentration (VSCC) region of transition metals can be used to correlate the changes of the electronic structure induced by structural phase transitions with the bulk behavior of the materials. Accordingly, the Quick AED tool presented herein can be used in selecting those transition metal materials having certain desired properties.

In another, non-limiting example, the identification of the matching molecule can be employed to maximize the molecule's change in state, malleability, color, resistance, permeability, degradability, breaking points, and the like to match a desired use for the molecule.

Chemical Reactivities

Once the present methods are performed to obtain the matching molecules, the knowledge can be used to determine which molecules specifically would be best suited for various chemical reactivities. This knowledge can then be extended to other molecules matching the identified first molecule identified as best suited for various chemical reactivities. The selected matching molecules(s), or parts of molecule(s) can then be synthesized to conduct further analysis on their suitability for various chemical reactivities.

Accordingly, the present tool is extremely helpful for determining which molecules are most likely to successfully complete various chemical reactions. In this regard, both the initially selected molecule and the matching molecule can be physically tested to ensure they share similar and desirable chemical reactivities under real world conditions.

Other Uses

Some of the other uses for the presently described tool include the following:

1. Help identify matching different molecules, and therefore synthesize new molecules, that can improve chemical processes (for example, assist in differentiating which catalyst is active or not to permit expediting reaction synthesis and industrial activities).
2. Differentiate which environmental molecules can be considered to be equally polluting based on their interactions with a given receptor, which can have implications on the wellbeing of humans and on saving our planet.
3. Guide decision makers in whether or not chemicals/drugs should be banned for the safety of the society, based on their AED similarities to other known harmful chemicals.
4. Help quality assurance teams by determining if different molecules may be toxic to the body or harmful to the environment, in which case their use should be rejected.
5. This tool has superiority in its competence of being widely applicable to endless applications in many industries with a robust performance (the tool can match different molecules with differences as small as 3%, 1%, 0.5%, and/or 0.05% in their AED values). It is thus a versatile tool which can be applicable/useful in ample industrial sectors.
6. Save many experimental tests and therefore save money, time, and the environment from experimenting on potentially harmful molecules.

The presently described subject matter can be further understood by referring to the following example.

EXAMPLES

Example 1

Example Table Used in Quick AED Calculation

A sample table used to generate a quick AED calculation appears as follows in Table 1:

TABLE 1

| | Element | Environment | Atomic property | AED |
|---|---|---|---|---|
| entry 1 | C | sCdOsS (+environment of each of the connecting atoms C, O and S, including non-covalent bonds at specified thresholds within 1.5 to 5 Angstroms) | value +/− std dev | value +/− std dev |
| entry 2 | C | sHsCdO (+environment of each of the connecting atoms H, C, O, including non-covalent bonds at specified thresholds within 1.5 to 5 Angstroms) | value +/− std dev | value +/− std dev |
| entry 3 | C | tCsH (+environment of each of the connecting atoms C and H, including non-covalent bonds at specified thresholds within 1.5 to 5 Angstroms) | value +/− std dev | value +/− std dev |
| more entries for C in different environments | | | | |
| entry . . . | N | sCdC (+environment of each of the connecting atoms C and S, including non-covalent bonds at specified thresholds within 1.5 to 5 Angstroms) | value +/− std dev | value +/− std dev |
| more entries for N in different environments | | | | |
| entry . . . | H | sC (+environment of each of the connecting atom C, including non-covalent bonds at specified thresholds within 1.5 to 5 Angstroms) | value +/− std dev | value +/− std dev |
| more entries for N in different environments | | | | |
| more entries for more elements in different environments. Diagram for comparisons | | | | |

As it appears in Table 1, s, d, and t, stand for single, double, and triple bonds, respectively; C, O, H, etc. are the elements carbon, oxygen, hydrogen, etc, respectively, listed in each environment alphabetically, and std dev is standard deviation associated with the average AED reported per element at a given environment as in the list of molecules as shown in the list of molecules. In this regard, for new molecules, it is sufficient to have for a given element (e.g., C) its direct environment, e.g., (sCsHdO). However, for conformers of molecules, for example, this description of “C” at an environment of first degree neighboring atoms “sCsHdO” is not sufficient; rather, it is necessary to go to the second degree of neighboring atoms including most importantly the non-covalently bounded second-degree neighboring atoms within 1.5 to 5 Angstroms from the first degree neighboring atoms.

A comparison of the quick AED calculation method as described herein vs. the traditional quantum methods of calculating AED is shown in Table 2, below.

TABLE 2

| | AED calculation via quantum simulations | AED estimation via the Table method |
|---|---|---|
| Steps | 1. Build molecule and create input file | 1. determine the matching element in an environment from the Table for all atoms of interest in a new molecule |
| | 2. Complete a quantum simulation for an optimization and a frequency calculation | 2. estimate AED |
| | 3. Complete a post-analysis simulation on the wavefunction file obtained from the previous step | |
| | 4. Obtain the atomic properties from the post-analysis step | |
| | 5. Calculate the AED | |
| Time | Minutes up to possibly weeks depending on the size of the molecule, the level of theory, and the machine capacity | Seconds up to minutes or possibly hours depending on the number of atoms of interest |
| Expertise required | Need computer scientists with experience in computational chemistry | No computational expertise needed for estimation the AEDs from the Table |
| Heat release | Proportional to the simulations time | None for new molecules |
| CO2 emissions to run the machines | Proportional to the simulations time | None for new molecules |
| Manpower | Demanding | Much less demanding |

It is to be understood that the methods and systems described herein are not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

I claim:

1. A quick and accurate method for creating and analyzing multiple molecules, bioisosteres of the multiple molecules, or conformers of the multiple molecules having desired chemical, material, or pharmaceutical properties, the method comprising steps performed using computer resources, said steps comprising:

generating a list of molecules and conformers of the molecules;

generating one or more tables of atoms in each molecule in the list of molecules and conformers of the molecules, wherein each atom in the one or more tables of atoms is identified by a combination of each atom's specific elemental type and environment, wherein said identification of each atom's specific environment includes identifying all non-covalently bounded second degree neighboring atoms within a distance of 1.5 to 5 Angstroms from each first degree neighboring atom of each molecule;

generating average electron densities (AEDs) for each part of each molecule in the list of molecules and conformers of the molecules, wherein each part of each molecule in the list of molecules and conformers of the molecules is determined using computational resources configured to implement quantum calculations;

selecting one or more further molecules;

identifying the one or more further molecule's atomic environment, said atomic environment for each said one or more further molecule including elements, types of bonds for each atom in the one or more further molecules, and which other elements each atom in the one or more further molecules is connected to through each bond, wherein said identifying includes identifying all non-covalently bounded second degree neighboring atoms within a distance of 1.5 to 5 Angstroms from each first degree neighboring atom of the respective one or more further molecules and excluding all non-covalently bounded second degree neighboring atoms outside a distance of 1.5 to 5 Angstroms from each first degree neighboring atom of the respective one or more further molecules;

finding an environment from the one or more tables of atoms in each molecule in the list of molecules and conformers of the molecules matching an environment for each atom in the one or more further molecules;

predicting an average electron density (AED) of the one or more further molecules or for a part of the one or more further molecules based on the matching environment from the one or more tables of atoms for each atom in the one or more further molecules;

matching the average electron density (AED) of the atoms of the one or more further molecules or the part of the one or more further molecules to an average electron density of atoms in multiple target molecules or parts of the multiple target molecules to computationally identify matching multiple further molecules, matching parts of the multiple further molecules, matching bioisosteres of the multiple further molecules, or matching conformers of the multiple further molecules, wherein the matching occurs for the atoms of the one or more further molecules or the part of the one or more further molecules having an average electron density (AED) value within up to a 10% deviation from the average electron density (AED) of the atoms of the target molecule or the part of the target molecule in the list of molecules and conformers of the molecules, wherein the 10% deviation is computed via computational expertise based on computational quantum simulations using high performance computing;

selecting the identified matching multiple further molecules, matching parts of the multiple further molecules, matching bioisosteres of the multiple further molecules, or matching conformers of the multiple further molecules by using high throughput screening assays for further analysis;

obtaining the identified matching multiple further molecules, matching parts of the multiple further molecules, matching bioisosteres of the multiple further molecules, or matching conformers of the multiple further molecules;

filtering and screening those identified matching multiple further molecules, matching parts of the multiple further molecules, matching bioisosteres of the multiple further molecules, or matching conformers of the multiple further molecules to determine whether the identified matching multiple further molecules, matching parts of the multiple further molecules, matching bioisosteres of the multiple further molecules, or matching conformers of the multiple further molecules have the desired material, chemical, or pharmaceutical properties, thereby enriching a hit rate as compared with typical random high throughput screening assays of molecules; and designing the screened identified matching multiple further molecules, matching parts of the multiple further molecules, matching bioisosteres of the multiple further molecules, or matching conformers of the multiple further molecules having the desired material, chemical, or pharmaceutical properties, wherein the designed screened identified matching multiple further molecules, matching parts of the multiple further molecules, matching bioisosteres of the multiple further molecules, or matching conformers of the multiple further molecules having the desired chemical, material, or pharmaceutical properties are used for one or more activities selected from the group consisting of optimizing pharmaceutical properties, improving potency, enhancing specificity, reducing side effects, saving money in developing new drugs, promoting the molecule's desired change in state, malleability, color, resistance, permeability, degradability, or breaking points, improving chemical processes, differentiating which catalyst is active or not; expediting reaction design; selecting environmental molecules can be considered that are minimally polluting based on their interactions with a given receptor; improving human environmental conditions by reducing levels of $CO_2$ emissions, improving the overall health of the Earth; identifying chemicals/drugs which should be banned for society's safety, determining toxicity; determining degree of harm to the environment, reducing use of costly experimental tests, and any combination thereof.

2. The method of claim 1, wherein the one or more tables of atoms in each molecule in the list of molecules and conformers of the molecules is generated by executing simulations involving a method comprising:

computationally building each molecule;

computationally running a quantum simulation of each molecule to obtain a wavefunction of each molecule;

computationally performing post processing on the wavefunction of each molecule to obtain atomic properties of each molecule;

computationally extracting volumes and electron populations, using computer resources, for each atom of each molecule of the multiple molecules, the bioisosteres of the multiple molecules, or the conformers of the multiple molecules at a specific isodensity;

computationally assigning each atom of each molecule of the multiple molecules bioisosteres of the multiple molecules, or conformers of the multiple molecules, using computational expertise and computer resources, an identity based on each atom's specific elemental identification and environment, wherein said identity of each atom of each molecule of the multiple molecules bioisosteres of the multiple molecules, or conformers of the multiple molecules includes an identification of all non-covalently bounded second degree neighboring atoms within a distance of 1.5 to 5 Angstroms from each first degree neighboring atom of each molecule of the multiple molecules bioisosteres of the multiple molecules, or conformers of the multiple molecules and an exclusion of all non-covalently bounded second degree neighboring atoms outside a distance of 1.5 to 5 Angstroms from each first degree neighboring atom of each molecule of the multiple molecules bioisosteres of the multiple molecules, or conformers of the multiple molecules; and listing each atom of each molecule of the multiple molecules bioisosteres of the multiple molecules, or conformers of the multiple molecules at a given environment as taken from each molecule of the multiple molecules bioisosteres of the multiple molecules, or conformers of the multiple molecules in the list of molecules and conformers of the molecules.

3. The method of claim 2, wherein the environment of each atom of the multiple target molecules or the parts of the multiple target molecules includes types of bonds each atom has, which are assigned computationally, which other atoms each atom is connected to through each bond, which are assigned via computational tools, and the distance between each atom of the multiple target molecules or the parts of the multiple target molecules and all non-covalently bounded second degree neighboring atoms of each atom of the multiple target molecules or the parts of the multiple target molecules is identified to be within a distance of 1.5 to 5 Angstroms from each first degree neighboring atoms.

4. The method of claim 3, wherein the types of bonds each atom has are assigned computationally and are selected from the group consisting of single(s), double (d), triple (t), and combinations thereof.

5. The method of claim 3, wherein the types of bonds of each atom are identified based on first degree neighboring atoms for new molecules and based on second degree neighboring atoms for conformers, including non-covalently bounded second degree neighboring atoms within a distance of 1.5 to 5 Angstroms of the first degree neighboring atoms and excluding non-covalently bounded second degree neighboring atoms outside a distance of 1.5 to 5 Angstroms of the first degree neighboring atoms.

6. The method of claim 2, wherein any overlapping environments of each atom in each molecule in the list of molecules and conformers of the molecules are matched with one common specific elemental type at a given environment having average plus and minus standard deviation values.

7. The method of claim 2, wherein the matching occurs for any of the one or more further molecules or part of the one or more further molecules having an average electron density (AED) value within up to a 1% deviation from the average electron density (AED) of the target molecule or the part of the target molecule in the list of molecules and conformers of the molecules.

8. The method of claim 1, further comprising contacting the identified matching further molecule with a receptor of interest in a high throughput screening assay and detecting binding of the molecule to the receptor.

9. The method of claim 8, wherein the desired chemical, material, or pharmaceutical properties are one or more selected from the group consisting of pharmacokinetic and pharmacodynamic properties, potency, solubility, permeability, metabolic stability, transporter effects, bioavailability, metabolism, clearance, toxicity, mechanical, electrical, thermal, magnetic, optical, and deteriorative properties which may impact surface chemistry.

10. The method of claim 1, wherein the identified further molecule has a desired interaction and chemical reactivity, material property, or biological activity.

11. The method of claim 1, wherein the matching occurs for any further molecule or part of the further molecule having an average electron density (AED) value within up to a 3% deviation from the average electron density (AED) of the target molecule or the part of the target molecule in the list of molecules and conformers of the molecules.

12. The method of claim 1, wherein the designed identified matching further molecules having the desired chemical, material, or pharmaceutical properties are used for one or more activities selected from the group consisting of identifying matching different molecules, and therefore design new molecules, that can improve chemical processes; differentiating which environmental molecules can be considered to be equally, more, or less polluting based on their interactions with a given receptor, which can have implications on the wellbeing of humans and on saving the planet; guiding decision makers in determining whether or not chemicals/drugs should be banned for the safety of society, based on their AED similarities to other known harmful chemicals; assisting quality assurance teams in determining whether different molecules may be toxic to the body or harmful to the environment, in which case their use should be rejected; and saving many experimental tests and therefore money, time, and the environment from experimentation on potentially harmful molecules.

13. The method of claim 1, wherein the method has an accuracy of about 95% in predicting, by the computational calculations, the AED of the one or more further molecules or for the part of the one or more further molecules.

14. A quick and accurate method for creating and analyzing multiple molecules, bioisosteres of the multiple molecules, or conformers of the multiple molecules having desired chemical, material, or pharmaceutical properties, the method comprising steps performed using computer resources, said steps comprising:

generating a list of molecules and conformers of the molecules;

generating one or more tables of atoms in each molecule in the list of molecules and conformers of the molecules, wherein each atom in the one or more tables of atoms in each molecule in the list of molecules and conformers of the molecules is generated by a method comprising:

computationally building each molecule;

computationally running a quantum simulation of each molecule to obtain a wavefunction of each molecule;

computationally performing post processing on the wavefunction of each molecule to obtain atomic properties of each molecule;

computationally extracting volumes and electron populations, using computer resources, for each atom of each molecule of the multiple molecules, the bioisosteres of the multiple molecules, or the conformers of the multiple molecules at a specific isodensity;

computationally assigning each atom of each molecule of the multiple molecules, the bioisosteres of the multiple molecules, or the conformers of the multiple molecules, using computational expertise and computer resources, an identity based on each atom's specific elemental identification and environment, wherein said identity of each atom of each molecule of the multiple molecules, the bioisosteres of the multiple molecules, or the conformers of the multiple molecules includes identifying all non-covalently bounded second degree neighboring atoms within a distance of 1.5 to 5 Angstroms from each first degree neighboring atom of each molecule of the multiple molecules, the bioisosteres of the multiple molecules, or the conformers of the multiple molecules and excluding all non-covalently bounded second degree neighboring atoms outside a distance of 1.5 to 5 Angstroms from each first degree neighboring atom of molecule of the multiple molecules, the bioisosteres of the multiple molecules, or the conformers of the multiple molecules; and listing each atom of each molecule of the multiple molecules, the bioisosteres of the multiple molecules, or the conformers of the multiple molecules at a given environment as taken from each molecule of the multiple molecules, the bioisosteres of the multiple molecules, or the conformers of the multiple molecules in the list of molecules and conformers of the molecules;

generating average electron densities (AEDs) for each part of each molecule in the list of molecules and conformers of the molecules, wherein each part of each molecule in the list of molecules and conformers of the molecules is determined using computational resources configured to implement quantum calculations;

selecting one or more further molecules;

identifying the one or more further molecule's atomic environment, said atomic environment for each said one or more further molecule including elements, types of bonds, interactions for each atom in the one or more further molecules, and which other atoms each atom in the one or more further molecules is connected to through each bond and interaction, wherein said identifying includes selecting all non-covalently bounded second degree neighboring atoms within a distance of 1.5 to 5 Angstroms from each first degree neighboring atom in the one or more further molecules and excluding all non-covalently bounded second degree neighboring atoms outside a distance of 1.5 to 5 Angstroms from each first degree neighboring atom of the respective one or more further molecules;

finding an environment from the table of atoms in each molecule in the list of molecules and conformers of the molecules matching an environment for each atom in the one or more further molecules;

predicting an average electron density (AED) of the one or more further molecules or for a part of the one or more further molecules based on the matching environment from the table of atoms for each atom in the one or more further molecules;

matching the average electron density (AED) of the atoms of the one or more further molecules or the part of the one or more further molecules to an average electron density of atoms in a target molecule or a part of the target molecule to identify matching multiple further molecules, matching parts of the multiple further molecules, matching bioisosteres of the multiple further molecules, or matching conformers of the multiple further molecules, wherein the matching occurs for the atoms of the one or more further molecules or the part of the one or more further molecules having an average electron density (AED) value within up to a 10% deviation from the average electron density (AED) of the atoms of the target molecule or the part of the target molecule in the list of molecules and conformers of the molecules;

selecting the identified matching further molecules, matching parts of the multiple further molecules, matching bioisosteres of the multiple further molecules, or matching conformers of the multiple further molecules by using high throughput screening assays for further analysis;

obtaining the identified matching further molecules, matching parts of the multiple further molecules, matching bioisosteres of the multiple further molecules, or matching conformers of the multiple further molecules;

binding the identified matching further molecule to an active site of a receptor of interest to determine presence of the desired chemical, material, or pharmaceutical properties;

filtering and screening, using high throughput screening assays, those identified matching multiple further molecules, matching parts of the multiple further molecules, matching bioisosteres of the multiple further molecules, or matching conformers of the multiple further molecules having the desired material, chemical, or pharmaceutical properties, thereby enriching a hit rate as compared with typical random high throughput screening assays of molecules; and designing the screened identified matching further molecules having the desired material, chemical, or pharmaceutical properties.

15. The method of claim 14, wherein the matching occurs for the atoms of the one or more further molecules or the part of the one or more further molecules having an average electron density (AED) value within up to a 10% deviation from the average electron density (AED) of the atoms of the target molecule or the part of the target molecule in the list of molecules and conformers of the molecules.

16. The method of claim 14, wherein the matching occurs for the atoms of the one or more further molecules or the part of the one or more further molecules having an average electron density (AED) value within up to a 3% deviation from the average electron density (AED) of the atoms of the target molecule or the part of the target molecule in the list of molecules and conformers of the molecules.

17. The method of claim 14, wherein the matching occurs for the atoms of the one or more further molecules or the part of the one or more further molecule having an average electron density (AED) value within up to a 1% deviation from the average electron density (AED) of the atoms of the target molecule or the part of the target molecule in the list of molecules and conformers of the molecules.

18. The method of claim 14, wherein the method permits each average electron density to be obtained in a few seconds.

19. The method of claim 14, wherein the designed identified matching further molecules having the desired chemical, material, or pharmaceutical properties are used for one or more activities selected from the group consisting of optimizing pharmaceutical properties, improving potency, enhancing specificity, reducing side effects, saving money in developing new drugs, promoting the molecule's desired change in state, malleability, color, resistance, permeability, degradability, or breaking points, improving chemical processes, differentiating which catalyst is active or not; expediting reaction design; selecting environmental molecules can be considered that are minimally polluting based on their interactions with a given receptor; improving human environmental conditions by reducing levels of $CO_2$ emissions, improving the overall health of the Earth; identifying chemicals/drugs which should be banned for society's safety, determining toxicity; determining degree of harm to the environment, reducing use of costly experimental tests, and any combination thereof.

20. The method of claim 14, wherein the method has an accuracy of about 95% in predicting the AED of the one or more further molecules or for the part of the one or more further molecules.

21. A method for identifying a molecule, a bioisostere of the molecule, or a conformer of the molecule having a desired chemical, material, or pharmaceutical property, the method comprising steps performed using computational resources, the method comprising:

generating a list of molecules and conformers of the molecules;

generating one or more tables of atoms in each molecule in the list of molecules and conformers of the molecules, wherein each atom in the one or more tables of atoms is identified by a combination of each atom's specific elemental type and environment, wherein the environment is defined by identifying non-covalently bounded second degree neighboring atoms within a distance of 1.5 to 5 Angstroms from each first degree neighboring atom;

generating average electron densities (AEDs) for each part of each molecule in the list of molecules and conformers of the molecules based on the environment for each atom;

identifying one or more further molecules;

determining, for each atom in the one or more further molecules, an atomic environment including non-covalently bounded second degree neighboring atoms within the distance of 1.5 to 5 Angstroms;

matching the atomic environments of each atom in the one or more further molecules to environments in the one or more tables;

predicting an average electron density (AED) for the one or more further molecules based on the matching environments, without performing quantum mechanical simulation of the one or more further molecules;

identifying one or more candidate molecules based on the predicted AED for the one or more further molecules being within a predefined deviation from an AED of a target molecule or a part thereof;

filtering the identified one or more candidate molecules by excluding molecules that do not satisfy the distance-based environment constraints;

screening the filtered candidate molecules using a high-throughput screening assay to experimentally determine whether each candidate molecule exhibits the desired chemical, material, or pharmaceutical property; and selecting a molecule having the desired chemical, material, or pharmaceutical property based on the property of each screened filtered molecule determined from the screening.

22. The method of claim 21, wherein the desired chemical, material, or pharmaceutical property comprises potency, toxicity, or pharmacokinetic behavior.

23. The method of claim 21, wherein the high-throughput screening assay comprises a biological or chemical screening assay.

24. The method of claim 21, wherein the screening the filtered candidate molecules using the high-throughput screening assay comprises contacting the filtered candidate molecules with a receptor of interest in the high-throughput screening assay and detecting binding of the filtered candidate molecules to the receptor.

25. The method of claim 21, wherein the screening the filtered candidate molecules using the high-throughput screening assay comprises evaluating interaction of the filtered candidate molecules with a target.

26. The method of claim 21, wherein the filtered candidate molecules are candidate compounds for pharmaceutical applications.

* * * * *